(12) United States Patent
Doglio et al.

(10) Patent No.: US 11,508,414 B2
(45) Date of Patent: Nov. 22, 2022

(54) STORAGE MODULE WITH REDUCED AIRFLOW IMPEDANCE AND IMPROVED STORAGE DEVICE DYNAMICS PERFORMANCE

(71) Applicant: Dell Products L.P., Round Rock, TX (US)

(72) Inventors: Jean Marie Doglio, Round Rock, TX (US); Chris E. Peterson, Austin, TX (US); Harold John Syring, Temple, TX (US); Paul Allen Waters, Austin, TX (US); Evangelos Koutsavdis, Leander, TX (US); Russell C. Smith, Taylor, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/221,577

(22) Filed: Apr. 2, 2021

(65) Prior Publication Data
US 2022/0319554 A1 Oct. 6, 2022

(51) Int. Cl.
*G11B 33/14* (2006.01)
*G06F 1/20* (2006.01)
*G06F 1/18* (2006.01)

(52) U.S. Cl.
CPC ............ *G11B 33/142* (2013.01); *G06F 1/187* (2013.01); *G06F 1/20* (2013.01)

(58) Field of Classification Search
None
See application file for complete search history.

(56) References Cited

U.S. PATENT DOCUMENTS

2021/0127522 A1* 4/2021 Wang et al. ......... G11B 33/142

* cited by examiner

*Primary Examiner* — Craig A. Renner
(74) *Attorney, Agent, or Firm* — McDermott Will & Emery LLP

(57) ABSTRACT

A cooling system for cooling a set of components in a compute module and an array of storage devices in a storage module, the array of storage devices comprising rows and columns. The storage module is wider than the compute module to accommodate a larger backplane. The backplane has large vertical vent openings for accommodating connectors of storage devices connecting to the backplane. Pairs of divider walls positioned between adjacent columns of storage devices form large channels for increased airflow between columns of storage devices and reduced airflow between adjacent rows of storage devices. The design allows for increased cooling performance and reduced acoustic energy (noise).

20 Claims, 6 Drawing Sheets

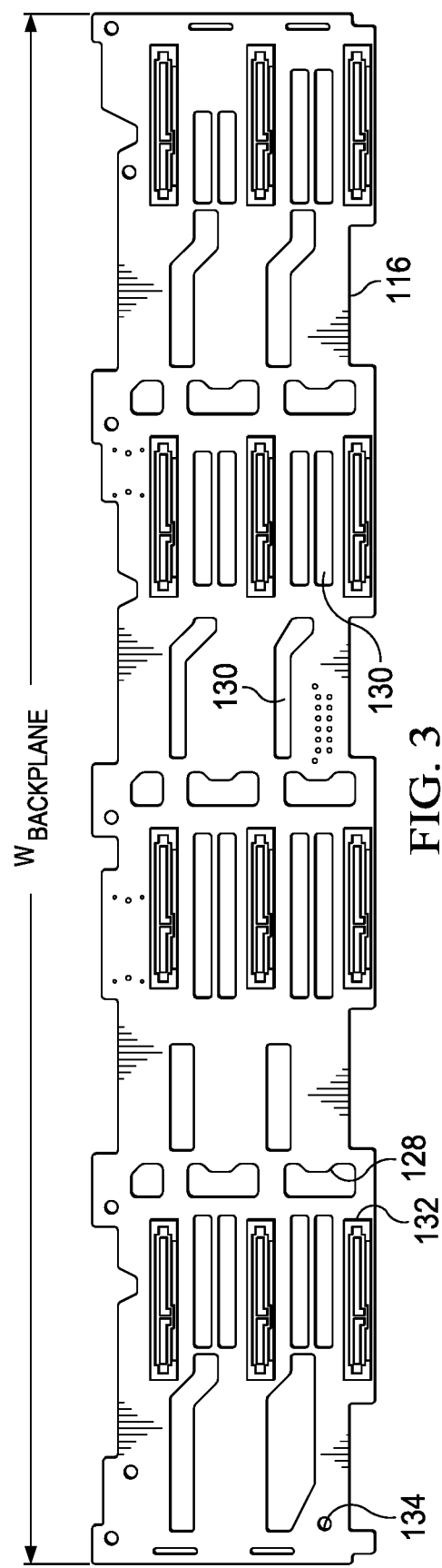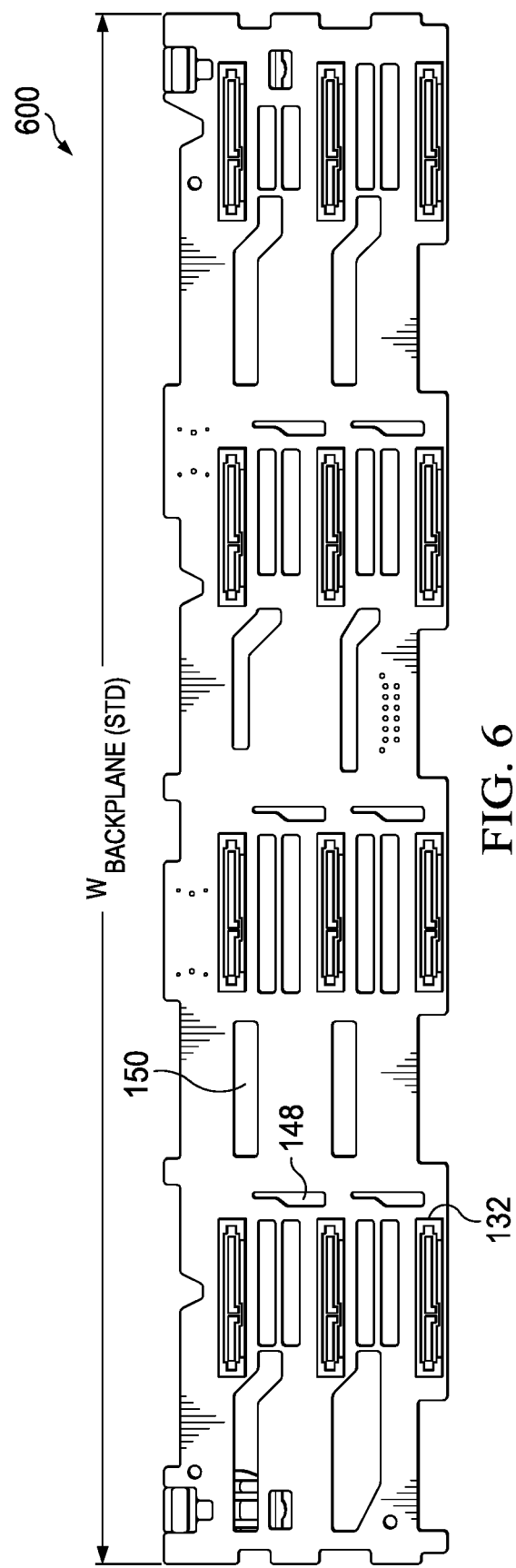

STORAGE MODULE WITH REDUCED AIRFLOW IMPEDANCE AND IMPROVED STORAGE DEVICE DYNAMICS PERFORMANCE

BACKGROUND

Field of the Disclosure

This disclosure relates generally to information handling systems and, more particularly, to modular storage modules with reduced airflow impedance and improved storage device dynamics performance.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include servers, gaming systems, desktop computers, and other information handling systems contained in a chassis with fans generating an airflow through the chassis to cool components.

SUMMARY

As information handling systems increase in complexity and performance capabilities, cooling the various components in the chassis also increases in complexity. Embodiments may be directed to an information handling system in a chassis. The chassis may be divided into a compute module and a storage module, wherein the compute module comprises a plurality of components and the storage module comprises an array of storage devices arranged in a plurality of columns and a plurality of rows.

In various embodiments, a disclosed cooling system for a chassis comprises a fan configured to generate an airflow to cool the plurality of components and the array of storage devices, a plurality of divider walls, wherein a pair of divider walls is positioned between two adjacent columns of the plurality of columns to form a channel, and a backplane positioned between the compute module and the storage module. The backplane is generally used to aggregate electrical signals from devices. The backplane comprises a plurality of vertical vent openings, wherein a set of vertical vent openings is aligned with each channel and the backplane comprises a backplane width greater than a compute module width of the compute module.

In some embodiments, each vertical vent opening in the set of vertical vent openings has a vertical vent opening width substantially equal to a separation distance between the pair of divider walls. In some embodiments, each divider wall of the pair of divider walls comprises a substantially continuous surface.

In some embodiments, the backplane comprises airflow openings oriented horizontally, wherein any airflow opening is configured to minimize airflow between adjacent rows of storage devices. In some embodiments, the backplane comprises other non-vent openings, wherein any non-vent opening is configured to allow minimal airflow, wherein substantially all airflow generated by the fan flows through the plurality of vertical vent openings. In some embodiments, the backplane width is larger than a standard backplane width. In some embodiments, the backplane width is approximately 435 mm.

In some embodiments, the storage module comprises a pair of fixed rails having a fixed rail width greater than the compute module width.

BRIEF DESCRIPTION OF THE DRAWINGS

For a more complete understanding of the present invention and its features and advantages, reference is now made to the following description, taken in conjunction with the accompanying drawings, in which:

FIG. 3 is a front view of one embodiment of the backplane for the chassis depicted in FIGS. 2A-2C;

FIG. 6 is a front view of a standard backplane.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments may be best understood by reference to FIGS. 1, 2A-2C, 3, 4A-4B and 5-6, wherein like numbers are used to indicate like and corresponding parts.

Figure 1:
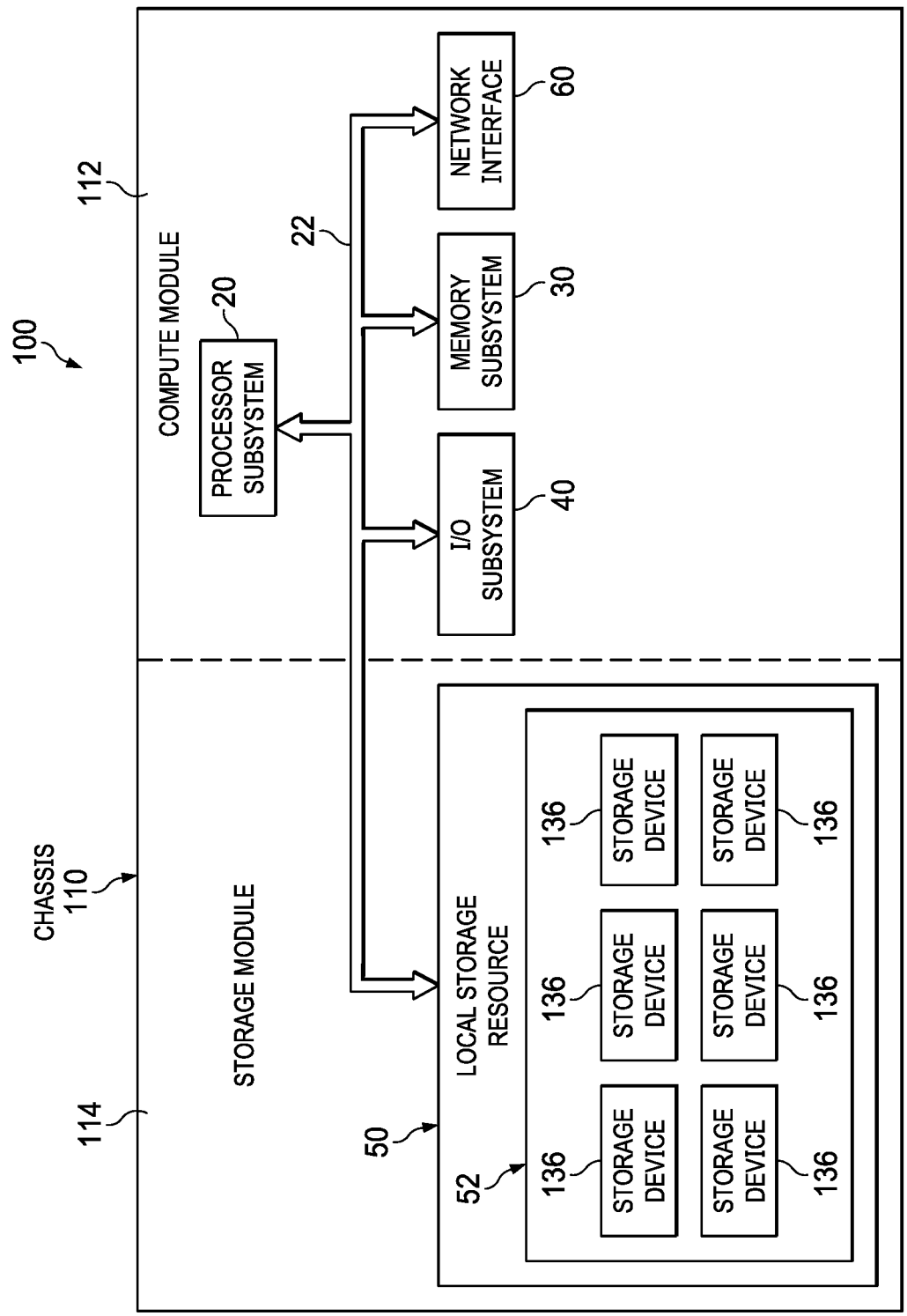
FIG. 1 is a block diagram of selected elements of an embodiment of an information handling system.

Turning now to the drawings, FIG. 1 illustrates a block diagram depicting selected elements of an embodiment of an information handling system 100 in a chassis 110 divided into a compute module 112 and a storage module 114.

As shown in FIG. 1, components of information handling system 100 may include, but are not limited to, processor subsystem 20, which may comprise one or more processors, and system bus 22 that communicatively couples various system components to processor subsystem 20 including, for example, a memory subsystem 30, an I/O subsystem 40, local storage resource 50 comprising array 52 of storage devices 136 and a network interface 60.

As depicted in FIG. 1, components of processor subsystem 20 may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, processor subsystem 20 may interpret and execute program instructions and process data stored locally (e.g., in memory subsystem 30). In the same or alternative embodiments, processor subsystem 20 may interpret and execute program instructions and process data stored remotely (e.g., in a network storage resource).

System bus 22 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Also, in FIG. 1, components of memory subsystem 30 may comprise a system, device, or apparatus operable to retain and retrieve program instructions and data for a period of time (e.g., computer-readable media). Components of memory subsystem 30 may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed.

In information handling system 100, components of I/O subsystem 40 may comprise a system, device, or apparatus generally operable to receive and transmit data to, from or within information handling system 100. Components of I/O subsystem 40 may represent, for example, a variety of communication interfaces, graphics interfaces for communicating with a display, video interfaces, user input interfaces, and peripheral interfaces. Components of I/O subsystem 40 may include more, fewer, or different input/output devices or components.

Components of local storage resource 50 may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; or any combination of the foregoing. Components of local storage resource 50 may comprise a plurality of storage devices 136 in an array 52, discussed in greater detail below.

Still referring to FIG. 1, components of network interface 60 may be a suitable system, apparatus, or device operable to serve as an interface between information handling system 100 and a network (not shown). Components of network interface 60 may enable information handling system 100 to communicate over a network using a suitable transmission protocol or standard. In some embodiments, components of network interface 60 may be communicatively coupled via a network to a network storage resource (not shown). A network coupled to components of network interface 60 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to components of network interface 60 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to network interface 160 or various components associated therewith may be implemented using hardware, software, or any combination thereof.

During operation of information handling system 100, components in the above-mentioned subsystems generate heat in performing the processes or purposes as mentioned above and require cooling. One approach to cooling information handling systems 100 comprises a fan generating an airflow through chassis 110. Embodiments disclosed herein may be directed to systems for improved cooling of array 52 of storage devices 136 in a modular chassis 110, with the additional benefit of improved storage device dynamics performance.

Referring to FIGS. 1 and 2A-2C, components of information handling system 100 may be divided into compute module 112 and storage module 114 containing backplane 116, with fan 118 positioned in compute module 112 for generating airflow through chassis 110. Sliding rails 120 on the sides of chassis 110 may facilitate installation and removal of chassis 110 in a rack or enclosure. In some embodiments, each sliding rail 120 may comprise a fixed rail section 122 for providing support to chassis 110 while installed.

Figure 2A:
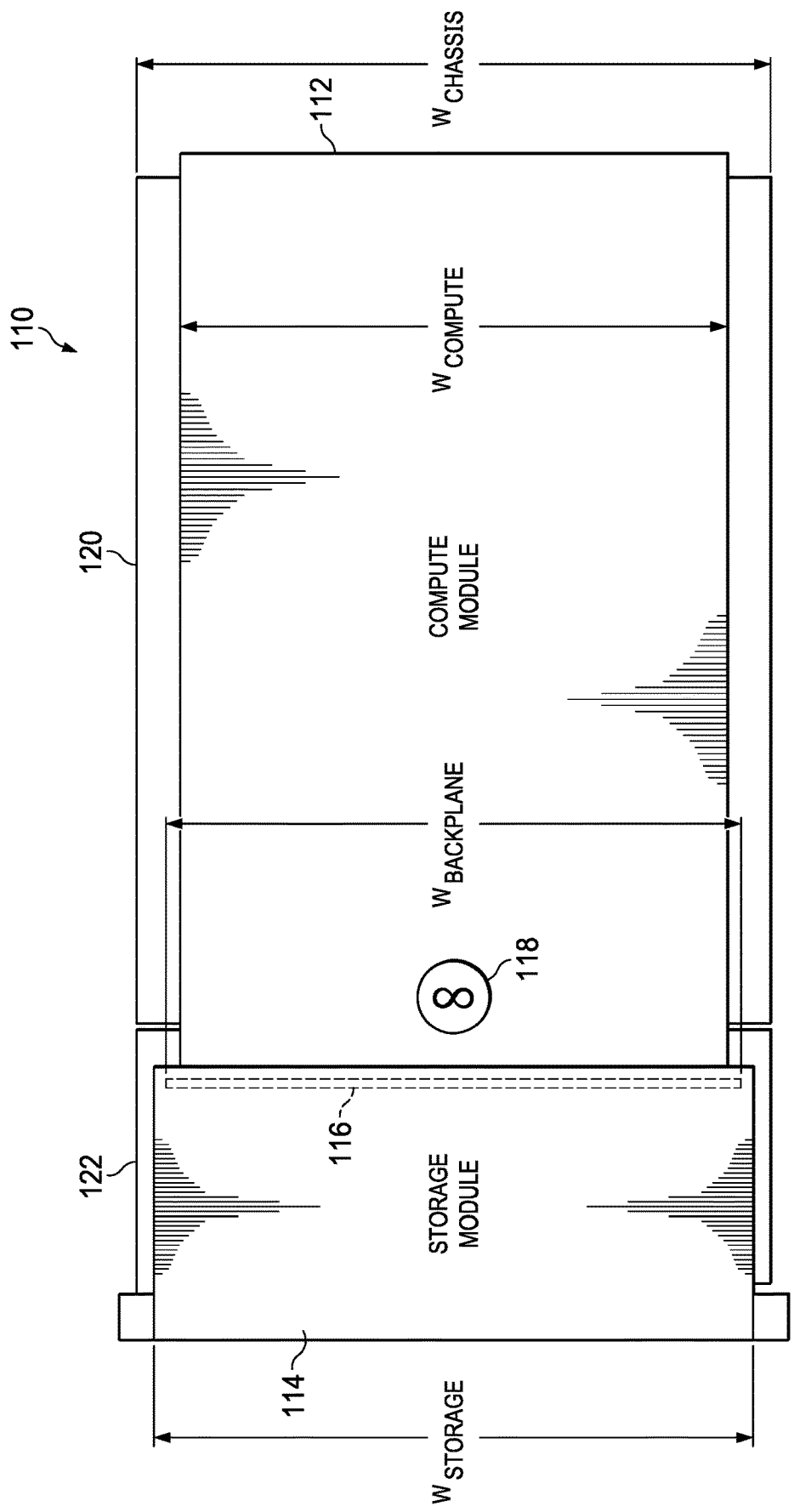
FIGS. 2A-2C are top, side and end views of an example chassis for an information handling system depicting a backplane dividing the chassis into a compute module and a storage module.
Figure 2B:
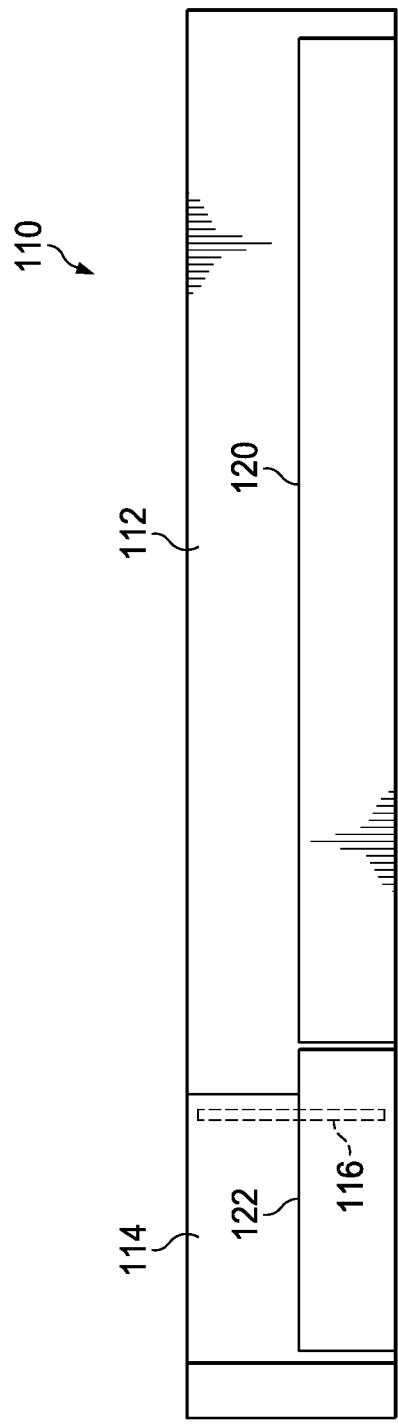
Figure 2C:
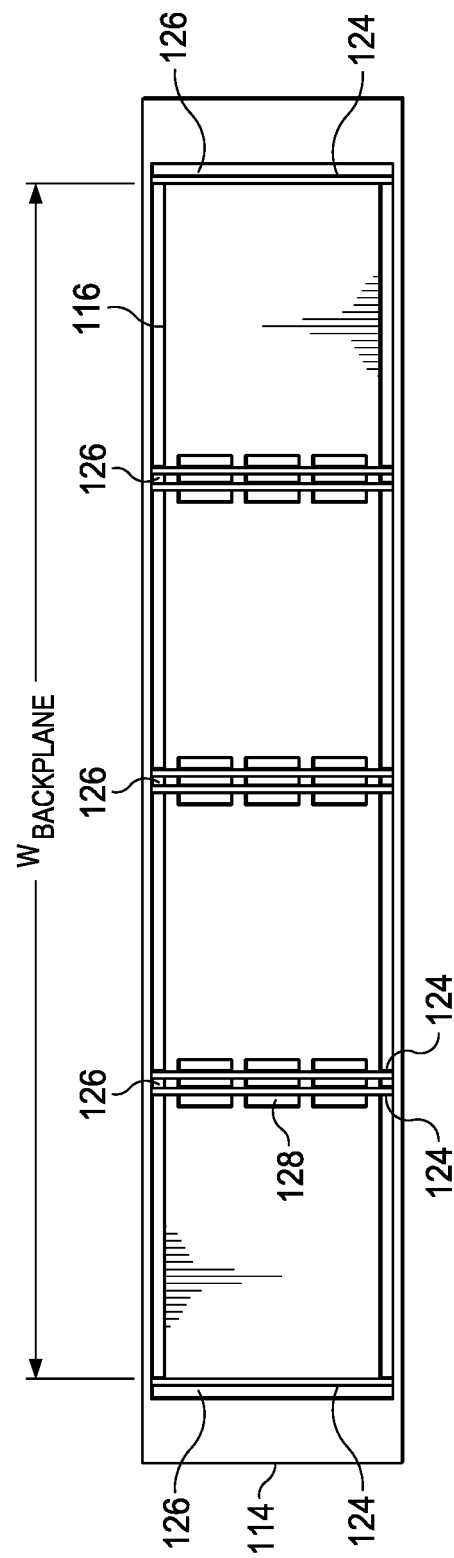

Referring to FIGS. 2A-2C, chassis 110 may have a compute module 112 and storage module 114 containing backplane 116. The compute module 112 may contain fan 118 for generating an airflow through storage module 114 and compute module 112. As depicted in FIG. 2C, storage module 114 may comprise multiple pairs of divider walls 124 separated by a distance to form channels 126 and aligned with sets of vertical vent openings 128 in backplane 116. Storage module 114 having a larger storage module width ($W_{STORAGE}$) allows each pair of divider walls 124 to be separated by a large channel 126 for increased airflow and increased airflow velocity.

The Storage Module May be Wider than the Compute Module

Chassis 110 has an outer width ($W_{CHASSIS}$) Based on an Outer Width of Sliding Rails 120 formed on the sides of compute module 112. Compute module 112 may have a width ($W_{COMPUTE}$) and comprise a set of sliding rails 120. Storage module 114 may have a storage module width ($W_{STORAGE}$) that is greater than the compute module width ($W_{COMPUTE}$). Storage module 114 having a larger storage module width ($W_{STORAGE}$) allows more space for increased airflow between adjacent columns of storage devices 136, discussed in greater detail below.

Backplane Limits Airflow to Vertical Vent Openings

Referring to FIG. 3, backplane 116 comprises a plurality of vertical vent openings 128 configured for attachment with storage devices 136 and allow airflow through backplane 116, wherein each vertical vent opening 128 is sized to ensure substantially all airflow passes through vertical vent openings 128. A height of each vertical vent opening 128 is larger than a width of that vertical vent opening 128. In some embodiments, backplane 116 may comprise horizontal openings 130 sized to allow airflow between storage devices 136. A height of each horizontal opening 130 is less than a width of the horizontal opening 130. However, horizontal openings 130 are sized smaller than vertical vent openings 128 such that substantially all airflow through backplane 116 passes through vertical vent openings 128. In other embodiments, storage devices 136 may not need airflow for cooling and horizontal openings 130 may be smaller or even absent from backplane 116.

Vertical vent openings 128 may be configured to receive attachment features of storage module. Connectors (not shown) on each storage device 136 may facilitate coupling the storage device 136 to backplane 116.

Backplane 116 with vertical vent openings 128 aligned with channels 126 between each pair of divider walls 124 directs a greater portion of airflow to pass through channels 126 to pass through channels 126 and thus reduces airflow over irregular surfaces of storage devices 136. Backplane 116 may have additional non-vent openings 134 necessary for assembly or other requirements. The non-vent openings 134 may be sized small enough to prevent or minimize any substantial airflow through the non-vent openings 134 and ensure substantially all airflow passes through vertical vent openings 128. Backplane 132 may be configured with ports 132 for electrically coupling storage devices 136 to other components in information handling system 100.

Figure 4A:
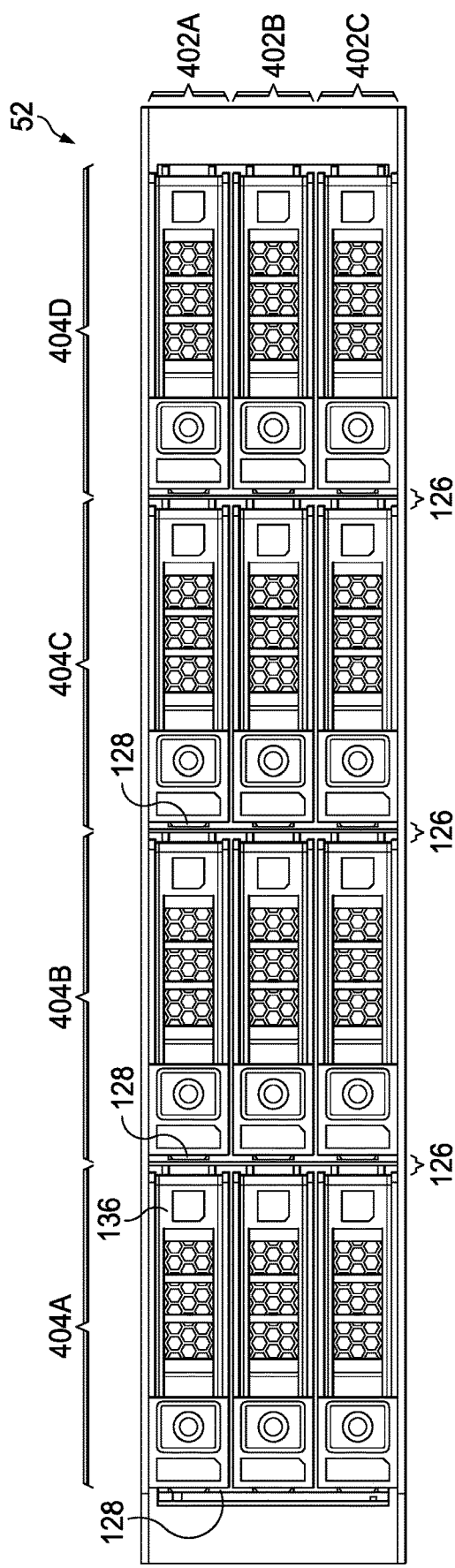
FIGS. 4A and 4B are front and back views of one embodiment of a storage module with an array of storage devices and a system for reduced airflow impedance and increased storage device dynamics performance.
Figure 4B:
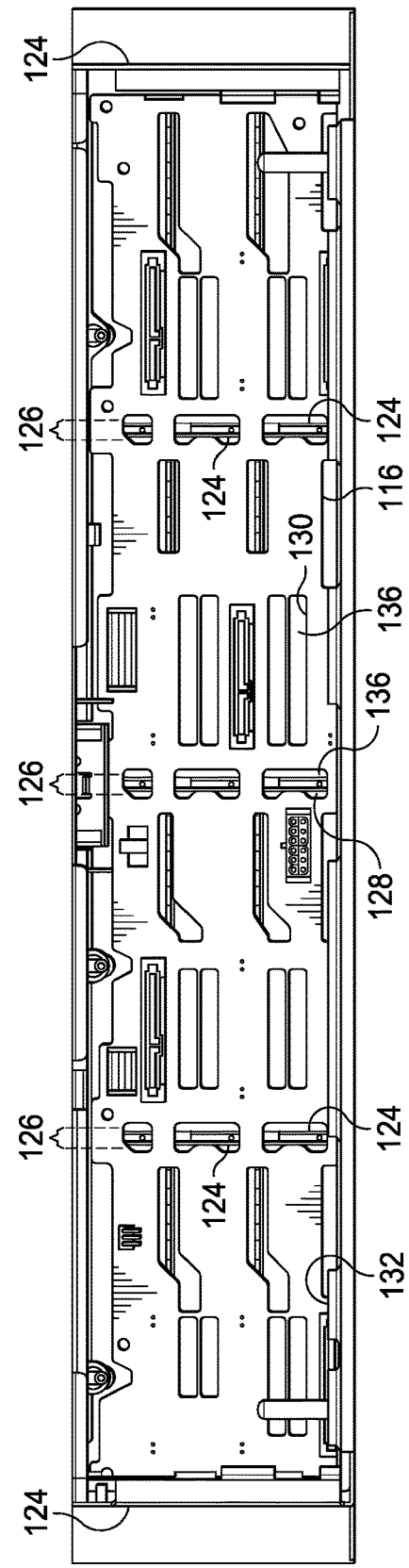

Referring to FIGS. 4A and 4B, storage module 114 may contain a plurality of storage devices 136 arranged in an array 114 of columns 404A-D and rows 402A-C. Each column 404 of storage devices 136 may be separated from an adjacent column 404 by a channel 126 formed between a pair of divider walls 124 (visible in FIG. 4B). Each storage device 136 may have rails or other features for coupling to backplane 116 and a divider wall 124 on either side.

Channels Between Adjacent Columns Direct Airflow to Vertical Vent Openings

In addition to backplane 116 comprising vertical vent openings 128 configured to allow substantially all airflow through backplane 116, embodiments of storage module 114 comprise channels 126 formed by pairs of divider walls 124 to ensure substantially all airflow passes through vertical vent openings 128 in backplane 116.

Each pair of divider walls 124 may be positioned between adjacent columns (e.g., between columns 404A and 404B, between columns 404B and 404C and between columns 404C and 404D) and separated by a distance to form a channel 126 to allow airflow between adjacent columns 404 of storage devices 136. The larger width of backplane 116 and storage module 114 allows for a greater width of each channel 126 for reduced impedance (or resistance) to airflow through channels 126. Larger channels 126 with lower airflow resistance allow for increased airflow velocity between adjacent columns 404 of storage devices 136. Since airflow generally follows the path of least resistance, larger channels 126 between adjacent columns of storage devices 136 and aligned with vertical vent openings 128 in backplane 116 result in a larger airflow capable of higher velocity between storage devices 136 in adjacent columns of storage devices 136 and also a lower airflow velocity between storage devices 136 in adjacent rows of storage devices 136.

Each divider wall 124 may be formed with a substantially continuous surface to reduce resistance to airflow through channels 126. Each divider wall 124 may be configured for coupling to storage devices 136. In addition, pairs of divider walls 124 increase the structural integrity of storage module 114 to reduce or prevent sag in chassis 110 and may isolate columns 404 of storage devices 136 from acoustic energy (noise) or electromagnetic energy generated by adjacent columns of storage devices 136.

Larger Storage Module Width Allows for Larger Channels

Referring still to FIGS. 2A-2C, 3 and 4A-4B, backplane 116 is configured for positioning between compute module 112 and storage module 114. Backplane 116 may be formed with a backplane width ($W_{BACKPLANE}$) greater than a compute module width ($W_{COMPUTE}$) of compute module 112. In some embodiments, backplane 116 may be formed with a backplane width ($W_{BACKPLANE}$) of approximately 435 mm. Backplane 116 may be configured with each set of vertical vent openings 128 aligned with a channel 126 such that airflow passes through channel 126 and a set of vertical vent openings 128 without changing direction.

Design Reduces Airflow Between Rows of Storage Devices

Figure 5:
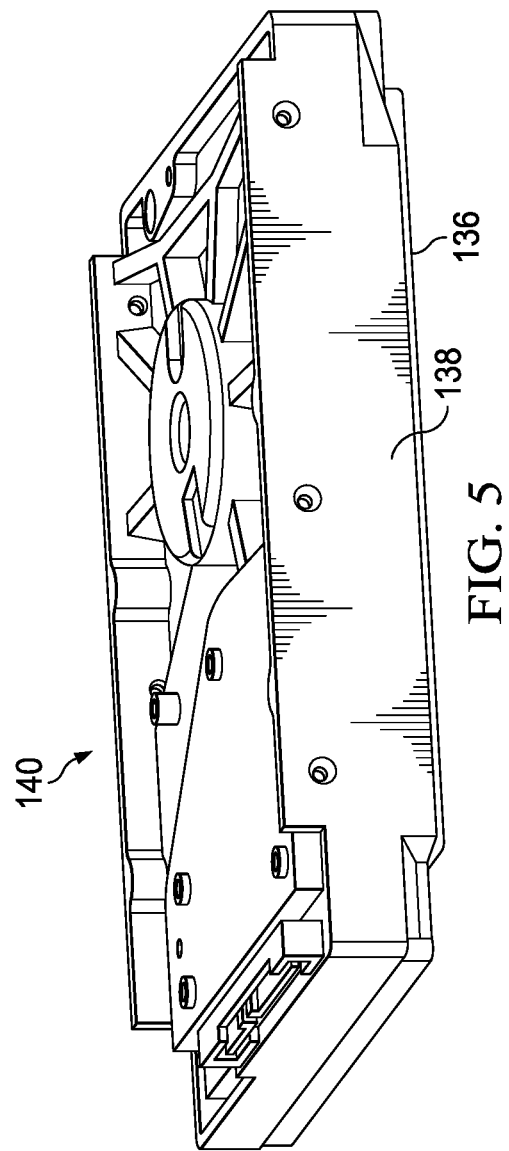
FIG. 5 is a perspective view of an example storage device, illustrating an irregular top surface.

Referring to FIG. 5, depicts a Hard Disc Drive (HDD) as an example storage device 136 with an irregular top surface 140. High airflow across irregular surfaces 140 of each storage device 136 and through narrow, irregular horizontal passages between adjacent rows 402 of storage devices 136 can generate turbulence and acoustic noise. Backplane 116 with vertical vent openings 128 aligned with large channels 126 between each pair of divider walls 124 ensures substantially all airflow passes through channels 126, which reduces or avoids airflow over irregular surfaces 140 of storage devices 136. In some embodiments, sides 138 of storage devices 136 may have substantially continuous surfaces. However, if the space between side 138 and a divider wall 124 is small, airflow may be slowed or turbulent or may be forced over irregular surfaces 140. In some embodiments, sides 138 of storage devices 136 may be configured for coupling to divider walls 124.

Simulated Operations Indicate Design Increases Airflow Velocity and Reduces Component Temperatures for Various Configurations Simulated operations of information handling systems 100 with embodiments disclosed herein may be compared to standard configurations in which a single divider wall (which may not be formed with a continuous surface) divides adjacent columns 404 of storage devices 136 and a narrower storage module (not shown) is configured with the same width as the compute module. Tables 1 and 2 depict results from simulated operations, illustrating the improved cooling and dynamics performance of embodiments disclosed herein over standard systems and approaches.

In many standard approaches, a backplane such as backplane 600 depicted in FIG. 6 divides compute module 112 from storage module 114. Backplane 600 may have a standard backplane width ($W_{BACKPLANE-STD}$) of 430 mm and have narrow attachment openings 148 and large horizontal airflow openings 150.

Comparing backplane 116 depicted in FIG. 3 with backplane 600 depicted in FIG. 6, backplane 116 may be 435 mm or larger, whereas backplane 600 may be constrained to a smaller width based on a storage module having the same width as the compute module 112. Even though the standard backplane width may be only 5 mm smaller than the backplane width of embodiments of backplane 116 described herein, the decreased width allows only a single divider wall (not shown) between adjacent columns 404 of storage devices 136. Furthermore, as compared with backplane 116 depicted in FIG. 3, a standard backplane 600 is typically formed with smaller and fewer attachment openings 148 and larger horizontal airflow openings 150. Thus, a standard backplane 600 typically reduces airflow between adjacent columns of storage devices 136 and forces more airflow over top surfaces 140 of storage devices 136. The narrow distance between adjacent columns of storage devices 136 leads to increased thus likely more turbulent and noisier airflow over the top surfaces 140. The airflow over the top surface 140 of storage devices 136 must make sharp-angled turns (usually in a vertical direction), resulting in a lower volumetric flow rate unless fan 118 operates at a higher fan speed. As a result, the airflow over storage devices 136 is less effective at removing heat and the temperatures of storage devices 136 will increase, which will negatively affect performance of storage devices 136 and information handling system 100.

Table 1 depicts values for a first information handling system 100 ("IHS 1") with the CPU power at 270 Watts, DIMM power at 10.3 Watts and an HPR fan operating at 100% maximum fan speed.

A first information handling system ("IHS 1") comprises a standard backplane 600 with a standard width ($W_{BACKPLANE-STD}$=430 mm) with narrow attachment openings 148 and large airflow openings 150 and with a single divider wall between adjacent columns 404 of storage devices 136.

A second information handling system 100 ("IHS 2") based on embodiments disclosed herein comprises a wider backplane 116 ($W_{BACKPLANE}$=435.2 mm) with large vertical vent openings 128 and smaller horizontal openings 130 and with pairs of divider walls 124 between adjacent columns 404 of storage devices 136.

TABLE 1

| | IHS 1 | IHS 2 |
|---|---|---|
| CPU POWER (Watts) | 270 | 270 |
| DIMM Power (Watts) | 10.3 | 10.3 |
| HPR FAN SPEED | 100% | 100% |
| AIRFLOW (CFM) | 122 | 139 |
| CPU1 $T_{CASE}$ (C.) | 75.6 | 73.3 |
| CPU2 $T_{CASE}$ (C.) | 78.1 | 74.9 |
| DEVICE 1 TEMP (C.) | 55.7 | 51.7 |
| DEVICE 2 TEMP (C.) | 52.4 | 48.9 |
| DEVICE 3 TEMP (C.) | 45.9 | 44.9 |
| DEVICE 4 TEMP (C.) | 46.0 | 44.9 |
| DEVICE 5 TEMP (C.) | 51.6 | 47.1 |
| DEVICE 6 TEMP (C.) | 49.1 | 45.3 |
| PSU1 Inlet Temp (C.) | 57.2 | 55.8 |
| PSU2 Inlet Temp (C.) | 65.5 | 59.8 |

In the simulated operation of both IHS 1 and IHS 2, the airflow through a storage module in IHS 1 was only 122 cubic feet per minute (CFM), whereas the airflow through storage module 114 in IHS 2 was increased to 139 CFM. Furthermore, in IHS 2, the temperatures of the components listed are all lower than the temperatures of corresponding components in IHS 1.

Table 2 depicts values for a first information handling system 100 ("IHS 1") with the CPU power at 270 Watts, DIMM power at 10.3 Watts and an VHP fan operating at 75% maximum fan speed.

A first information handling system ("IHS 1") comprises a standard backplane 600 with a standard width ($W_{BACKPLANE-STD}$=430 mm) with narrow attachment openings 148 and large horizontal airflow openings 150 and with a single divider wall between adjacent columns 404 of storage devices 136.

A second information handling system 100 ("IHS 2") based on embodiments disclosed herein comprises a wider backplane 116 ($W_{BACKPLANE}$=435.2 mm) with large vertical vent openings 128 and smaller horizontal openings 130 and with pairs of divider walls 124 between adjacent columns 404 of storage devices 136.

TABLE 2

| | IHS 1 | IHS 2 |
|---|---|---|
| CPU POWER (Watts) | 270 | 270 |
| DEVIM Power (Watts) | 10.3 | 10.3 |
| VHP FAN SPEED | 75% | 75% |
| AIRFLOW (CFM) | 132 | 149 |
| CPU1 $T_{CASE}$ (C.) | 73.7 | 71.7 |
| CPU2 $T_{CASE}$ (C.) | 74.9 | 73.1 |
| DEVICE 1 TEMP (C.) | 53.9 | 50.6 |
| DEVICE 2 TEMP (C.) | 51.3 | 48.4 |
| DEVICE 3 TEMP (C.) | 45.8 | 45.5 |
| DEVICE 4 TEMP (C.) | 46.1 | 46.0 |
| DEVICE 5 TEMP (C.) | 50.9 | 48.9 |
| DEVICE 6 TEMP (C.) | 48.4 | 46.2 |
| PSU1 Inlet Temp (C.) | 58.7 | 56.3 |
| PSU2 Inlet Temp (C.) | 57.8 | 57.0 |

In the simulated operation of both IHS 1 and IHS 2, the airflow through a storage module in IHS 1 was only 132 cubic feet per minute (CFM), whereas the airflow through storage module 114 in IHS 2 was increased to 149 CFM. Furthermore, in IHS 2, the temperatures of the components listed were all lower than the temperatures of the corresponding components in IHS 1.

Simulated operation of embodiments has indicated that chassis 110 formed with a wider storage module 114, a wider backplane 116 with larger vertical vent openings 128 and small horizontal openings 130, and with wider channels 126 formed by pairs of divider walls 124 may support information handling systems 100 operating at 300 Watts (CPU power) and 12 Watts (DIMM) with VHP fans 118 operating at 75% maximum fan speed and potentially support 350 W (CPU power) with 12 Watts (MINIM) and VHP fans 118 operating at 75% maximum fan speed.

Embodiments Reduce Acoustic Energy (Noise) and Vibration

An increased separation distance between divider walls 124 in a pair of divider walls 124 results in a wider storage module 114 than the compute module 112, but the benefits include a greater possible airflow between columns 404 of storage devices 136 for improved cooling. Furthermore, embodiments may result in a decrease in acoustic energy and vibration experienced by storage devices 136. For example, operation simulations indicate embodiments may reduce acoustic energy (noise) by approximately 4 dB for all frequencies greater than 3 kHz and vibration energy at the blade pass frequency (BPF) may be reduced by an order of magnitude.

Embodiments may also reduce acoustic energy (noise) for improved device performance. For example, operation simulations indicate embodiments may increase the dynamic fan speed limit from 75% of a maximum fan speed to 90% of the maximum fan speed without exceeding a dynamics threshold. Dynamics thresholds may include acoustical and/or vibration limits for normal operations of devices such as storage devices 136.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A cooling system for a chassis comprising a compute module comprising a plurality of components and a storage module comprising an array of storage devices arranged in a plurality of columns and a plurality of rows, the cooling system comprising:
   a fan configured to generate an airflow to cool the plurality of components and the array of storage devices;
   a plurality of pairs of divider walls, wherein each pair of divider walls is positioned between two adjacent columns of the plurality of columns, wherein each pair of divider walls forms a channel; and
   a backplane positioned between the compute module and the storage module, the backplane comprising a plurality of vertical vent openings, wherein a set of vertical vent openings is aligned with each channel and the backplane comprises a backplane width greater than a compute module width of the compute module.

2. The cooling system of claim 1, wherein the storage module comprises a pair of fixed rails having a fixed rail width greater than the compute module width.

3. The cooling system of claim 1, wherein each vertical vent opening in the set of vertical vent openings has a vertical vent opening width substantially equal to a separation distance between the pair of divider walls.

4. The cooling system of claim 3, wherein each divider wall of the pair of divider walls comprises a substantially continuous surface.

5. The cooling system of claim 1, wherein the backplane comprises a plurality of horizontal airflow openings, wherein each horizontal airflow opening is configured to reduce airflow between two adjacent rows of the storage devices.

6. The cooling system of claim 5, wherein the backplane comprises non-vent openings, wherein each non-vent opening is configured to allow minimal airflow, wherein substantially all airflow generated by the fan flows through the plurality of vertical vent openings.

7. The cooling system of claim 1, wherein the backplane width is approximately 5 mm wider than the compute module width.

8. A chassis having a chassis width, the chassis comprising:
   a compute module having a compute module width less than the chassis width and comprising:
      a plurality of components; and
      a pair of sliding rails, wherein the compute module and the pair of sliding rails defines the chassis width;
   a storage module having a storage module width greater than the compute module width, the storage module comprising:
      an array of storage devices arranged in a plurality of columns and a plurality of rows; and
      a plurality of pairs of divider walls, wherein each pair of divider walls is positioned between two adjacent columns of the plurality of columns, wherein each pair of divider walls forms a channel;
   a fan configured to generate an airflow to cool the plurality of components and the array of storage devices; and
   a backplane positioned between the compute module and the storage module, the backplane comprising a plurality of vertical vent openings, wherein a set of vertical vent openings is aligned with each channel and the backplane comprises a backplane width greater than the compute module width of the compute module.

9. The chassis of claim 8, wherein the storage module comprises a pair of fixed rails having a fixed rail width greater than the compute module width.

10. The chassis of claim 8, wherein each vertical vent opening in the set of vertical vent openings has a vertical vent opening width substantially equal to a separation distance between the pair of divider walls.

11. The chassis of claim 10, wherein each divider wall of the pair of divider walls comprises a substantially continuous surface.

12. The chassis of claim 8, wherein the backplane comprises a plurality of horizontal airflow openings, wherein each horizontal airflow opening is configured to reduce airflow between two adjacent rows of the storage devices.

13. The chassis of claim 12, wherein the backplane comprises non-vent openings, wherein each non-vent opening is configured to allow minimal airflow, wherein substantially all airflow generated by the fan flows through the plurality of vertical vent openings.

14. The chassis of claim 8, wherein the backplane width is approximately 5 mm wider than the compute module width.

15. An information handling system comprising:
   a chassis separated into a compute module and a storage module, wherein
      the compute module has a compute module width less than a chassis width and comprises:
         a plurality of components; and a pair of sliding rails, wherein the compute module and the pair of sliding rails defines the chassis width; and the storage module has a storage module width greater than the compute module width and comprises:

an array of storage devices arranged in a plurality of columns and a plurality of rows; and a plurality of pairs of divider walls, wherein each pair of divider walls is positioned between two adjacent columns of the plurality of columns, wherein each pair of divider walls forms a channel;

a fan configured to generate an airflow to cool the plurality of components and the array of storage devices; and a backplane positioned between the compute module and the storage module, the backplane comprising a plurality of vertical vent openings, wherein a set of vertical vent openings is aligned with each channel and the backplane comprises a backplane width greater than the compute module width of the compute module.

16. The information handling system of claim 15, wherein each vertical vent opening in the set of vertical vent openings has a vertical vent opening width substantially equal to a separation distance between the pair of divider walls.

17. The information handling system of claim 16, wherein each divider wall of the pair of divider walls comprises a substantially continuous surface.

18. The information handling system of claim 15, wherein the backplane comprises a plurality of horizontal airflow openings, wherein each horizontal airflow opening is configured to reduce airflow between two adjacent rows of the storage devices.

19. The information handling system of claim 18, wherein the backplane comprises non-vent openings, wherein each non-vent opening is configured to allow minimal airflow, wherein substantially all airflow generated by the fan flows through the plurality of vertical vent openings.

20. The information handling system of claim 15, wherein the backplane width is approximately 5 mm wider than the compute module width.

* * * * *